United States Patent
Martelock et al.

(10) Patent No.: US 12,105,953 B2
(45) Date of Patent: Oct. 1, 2024

(54) ZERO CODER COMPRESSION

(71) Applicant: Apple Inc., Cupertino, CA (US)

(72) Inventors: Christian Martelock, Bonn (DE); Eric Bainville, Sunnyvale, CA (US); Ali Sazegari, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 323 days.

(21) Appl. No.: 17/585,479

(22) Filed: Jan. 26, 2022

(65) Prior Publication Data

US 2023/0081845 A1 Mar. 16, 2023

Related U.S. Application Data

(60) Provisional application No. 63/243,690, filed on Sep. 13, 2021.

(51) Int. Cl.
*G06F 3/06* (2006.01)
(52) U.S. Cl.
CPC ............ *G06F 3/0608* (2013.01); *G06F 3/064* (2013.01); *G06F 3/0679* (2013.01)

(58) Field of Classification Search
CPC ...... G06F 3/0608; G06F 3/064; G06F 3/0679; H03M 7/6047; H03M 7/3066
See application file for complete search history.

(56) References Cited

U.S. PATENT DOCUMENTS

| | | | |
|---|---|---|---|
| 2020/0107108 A1* | 4/2020 | Gong | H04L 45/12 |
| 2021/0224191 A1* | 7/2021 | Wang | G06F 12/1072 |

\* cited by examiner

*Primary Examiner* — Daniel C Washburn
*Assistant Examiner* — Athar N Pasha
(74) *Attorney, Agent, or Firm* — BAKERHOSTETLER (57) ABSTRACT

The subject technology groups received data in data blocks having a predetermined number of bytes. For each received data block, a compressed data block is written to an output buffer. The compressed data block includes a mask block having a same number of bits as the predetermined number, and a subsequent block. The mask block includes in a same order as bytes within the corresponding data block, a zero corresponding to a zero-byte within the data block, and a one corresponding to each non-zero byte within the data block. The subsequent block includes non-zero bytes within the corresponding data block in a same order as the non-zero bytes within the data block.

20 Claims, 6 Drawing Sheets

ZERO CODER COMPRESSION

CROSS-REFERENCE TO RELATED APPLICATIONS

This application is claims priority to U.S. Provisional Patent Application No. 63/243,690, filed Sep. 13, 2021, which is hereby incorporated herein by reference.

TECHNICAL FIELD

The present description relates generally to data compression, and in particular to a lossless data compression algorithm.

BACKGROUND

Lossless data compression is used in many places: operating systems, file systems, software or asset distribution, for multimedia files, machine learning, in firmwares, etc. In some implementations, there may be tight restrictions and/or requirements around the available memory footprint, encode and decode speed, compression ratio, and the like.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

Devices such as wireless earphones may have substantial physical size constraints for including hardware including buttons, batteries, processors, memory and speakers. These physical size constraints may impose tight restrictions on the available microarchitecture, memory footprint, processing speeds, energy requirements, and/or compression ratio used by the devices.

For example, in situations where a pair of earphones (or earbuds) communicate with each other and/or with a device to which the earphones are paired and/or connected, state information may be periodically and/or occasionally exchanged among the earphones and/or the device. Earphones or earbuds may be audio output devices that are wireless connected to each other and/or are wirelessly connected to a device providing an audio stream to be output. One such situation occurs when a device is connected to only one of the pair of earphones, the primary earphone. For various reasons, such as, but not limited to, removal of the primary earphone from the ear, or a low power level of the primary earphone, the secondary earphone may need to be promoted to be the primary earphone. Before the promotion can take place, the current primary earphone's state may need to be transferred as quickly and power-efficiently as possible to, e.g., the secondary earphone. Since the state has to be encoded, transmitted and decoded, the complete round trip needs to be as efficient as possible. In this regard, the state information may have a data format that results in the state information including a substantial number of zero bytes (e.g., data bytes that include only zeros).

The subject system utilizes a lossless compression algorithm that provides for efficient compression of data streams that include a substantial number of zero bytes, such as the aforementioned state information. In the subject system, a mask byte is used in compression to indicate whether a predetermined number of subsequent bytes are zero-bytes (represented by a 0 in the mask byte), or non-zero bytes (represented by a 1 in the mask byte). If one of the subsequent bytes is a zero-byte, the byte is removed from the compressed data stream. In this manner, the subject system provides for an efficient compression algorithm that can operate effectively on platforms with limited processing resources, such as an earphone.

Figure 1:
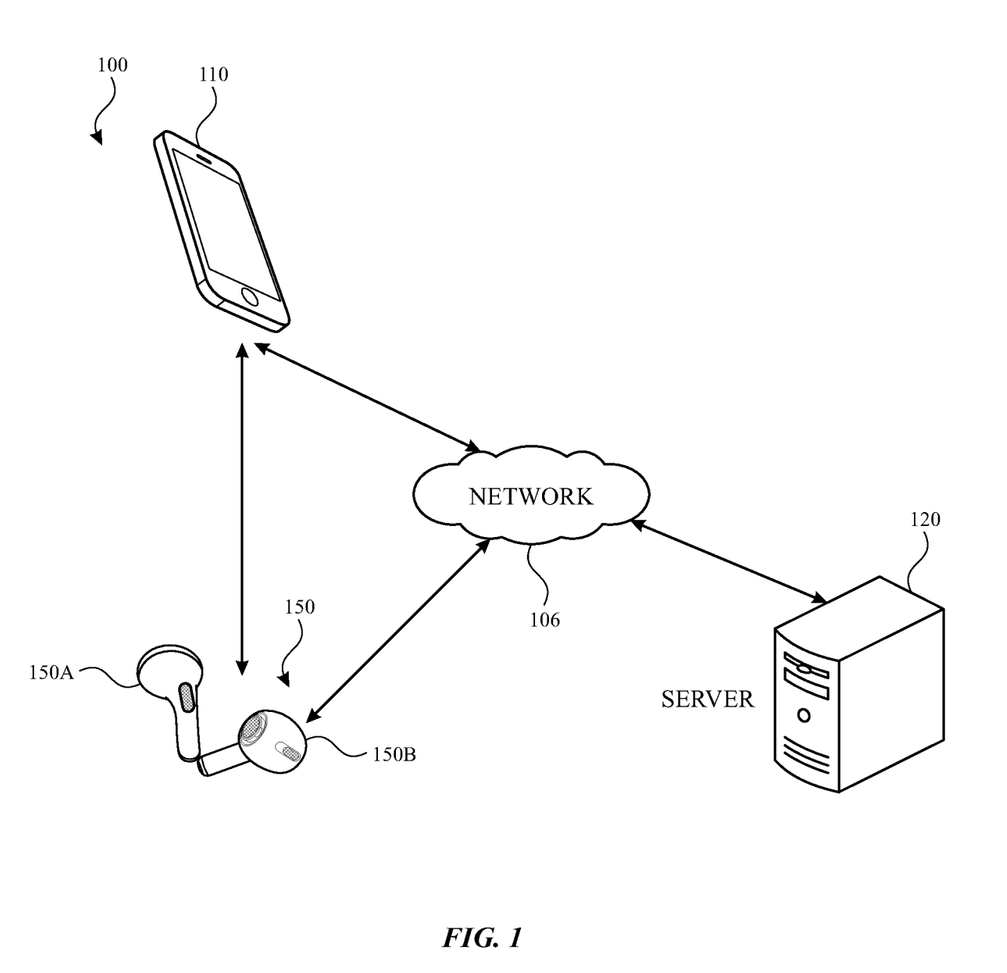
FIG. 1 illustrates an example of an environment in which state information between devices is exchanged in accordance with one or more implementations.

FIG. 1 illustrates an example of an environment in which state information between devices is exchanged in accordance with one or more implementations. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

The network environment 100 includes an electronic device 110, a server 120, and an electronic device 150 (i.e., one or both of 150A and 150B). The network 106 may communicatively (directly or indirectly) couple the electronic device 110 and/or the server 120, the electronic device 150 (i.e., one or both of 150A and 150B) and/or the server 120, the electronic device 110 and/or the electronic device 150 (i.e., one or both of 150A and 150B). In one or more implementations, the network 106 may be an interconnected network of devices that may include, or may be communicatively coupled to, the Internet. For explanatory purposes, the network environment 100 is illustrated in FIG. 1 as including an electronic device 110, an electronic device 150 (including devices 150A and 150B), an and a server 120; however, the network environment 100 may include any number of electronic devices and any number of servers.

The electronic device 110 may be, for example, desktop computer, a portable computing device (e.g., a laptop computer, a smartphone, etc.), a peripheral device (e.g., a digital camera, headphones), a tablet device, a wearable device (e.g., a watch, a band, etc.), a computing device (e.g., an embedded computing device), and the like, or any other appropriate device.

In some implementations, the electronic device 110 includes, for example, one or more wireless interfaces, such as WLAN radios, cellular radios, Bluetooth radios, Zigbee radios, near field communication (NFC) radios, and/or other wireless radios.

Figure 7:
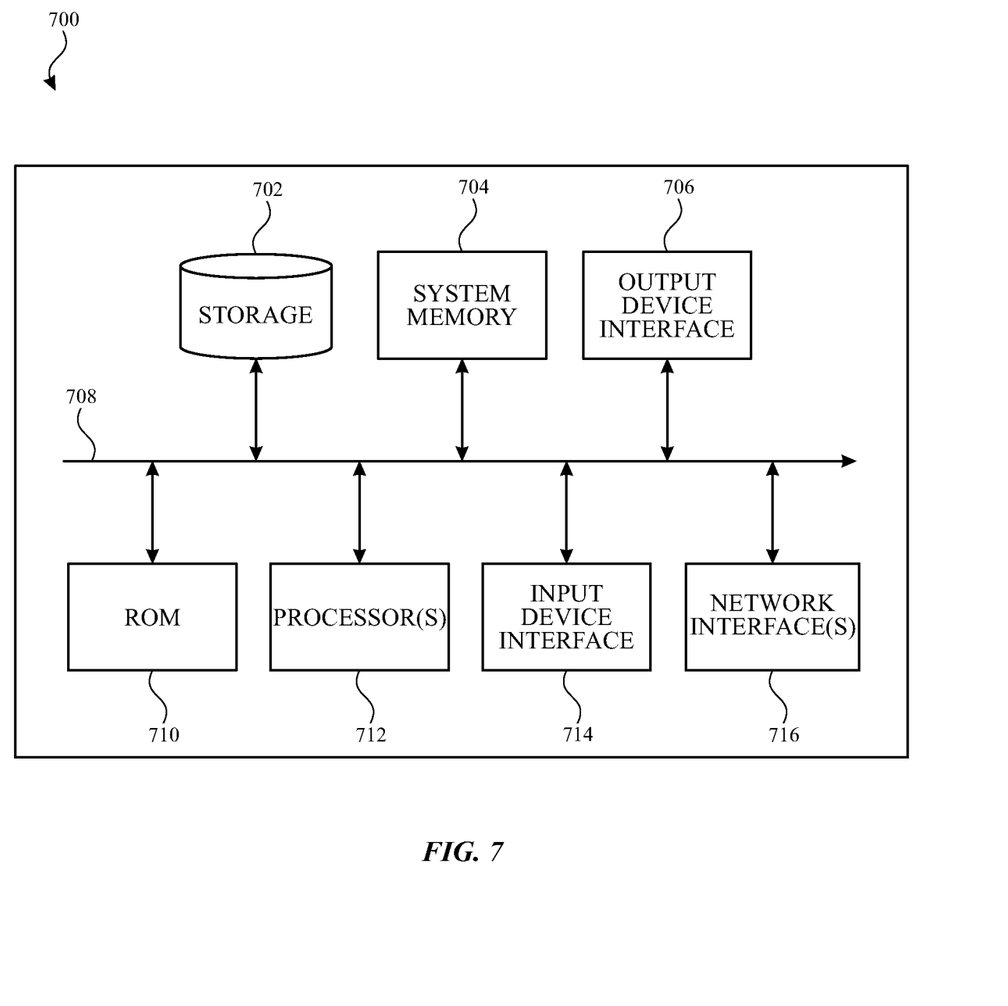
FIG. 7 illustrates an electronic system with which one or more implementations of the subject technology may be implemented.

The electronic device 110 may be, and/or may include all or part of, the electronic system discussed herein with respect to FIG. 7. In one or more implementations, the electronic device 110 may include a touchscreen, a camera, a microphone and/or other components. In some implementations, the electronic device 110 may be, for example, a portable computing device (e.g., a laptop computer) that includes a touchscreen, a smartphone that includes a touchscreen, a peripheral device that includes a touchscreen (e.g., a digital camera, headphones), a tablet device that includes a touchscreen, a wearable device that includes a touchscreen (e.g., a watch, a band, etc.), a computing device (e.g., an embedded computing device) that includes a touchscreen, and the like, any other appropriate device that includes, for example, a touchscreen, or any electronic device with a touchpad. The electronic device 110, may further include motion sensors such as gyroscopes, accelerometers, global positioning system (GPS) components, magnetic sensors such as compasses, and the like, and may be, for example, a smart phone or media player device. Additionally, the electronic device 110 includes a memory on which data can be stored. In FIG. 1, by way of example, the electronic device 110 is depicted as a smartphone.

In one or more implementations, the electronic device 150 (i.e., one or both of 150A and 150B) may be, for example, a desktop computer, a portable computing device (e.g., a laptop computer, a smartphone, etc.), a peripheral device (e.g., a digital camera, headphones, etc.), a tablet device, a wearable device (e.g., a watch, a band, etc.), a computing device (e.g., an embedded computing device), and the like, or any other appropriate device.

In one or more implementations, the electronic device 150 (i.e., one or both of 150A and 150B) may include a touchpad, one or more buttons, a camera, a microphone, one or more speakers, and/or other components. In some implementations, the electronic device 150 may be, for example, a peripheral device that includes a touchpad, a microphone and one or more speakers, (e.g., one or a pair of earphones or earbuds), a wearable device that includes a touchscreen, microphone and one or more speakers (e.g., a watch, a band, etc.), or any other appropriate device that includes, for example, one or more output devices. The electronic device 150, may further include one or more sensors (e.g., compasses, pressure sensors, touch sensors, and the like), and a processor for processing data (e.g., audio, video, audiovisual, and the like) (e.g., generated data, received data, stored data, data to be transmitted, etc.). Additionally, the electronic device 150 includes a memory on which data can be stored. In FIG. 1, by way of example, the electronic device 150 is depicted as a pair of earbuds 150A and 150B. However, the electronic device 150 can be any suitable type of electronic device.

In one or more implementations, the electronic device 150 may be, and/or may include all or part of the electronic system discussed below with respect to FIG. 7. The electronic device 110 may also provide data in the form of media (e.g., audio, video, audiovisual, and the like) to electronic device 150 and/or the server 120 (e.g., directly over a wired or wireless peer-to-peer connection or over the network 106 with the electronic device 110, and/or the server 120).

In one or more implementations, the server 120 provides a remote data storage for storing data associated with or generated by the electronic device 110 and/or the electronic device 150. It should be appreciated that the electronic device 110, the electronic device 150 and/or server 120 can access and exchange data stored on other devices and/or servers directly (e.g., without network 106) using wireless signals such as near-field communications (NFC), Bluetooth signals, direct WiFi signals, and/or wired connections.

By way of example, FIG. 1 shows a network environment 100 in which a user interacts directly with the electronic device 110 using input devices such as a touchscreen thereof to access and/or manipulate data stored on the electronic device 110, electronic device 150 and/or the server 120 through an application such as a media player running on the electronic device 110. In such an environment, the electronic device 110 is the primary device while the server 120 and/or the electronic device 150 are the secondary device.

Figure 2:
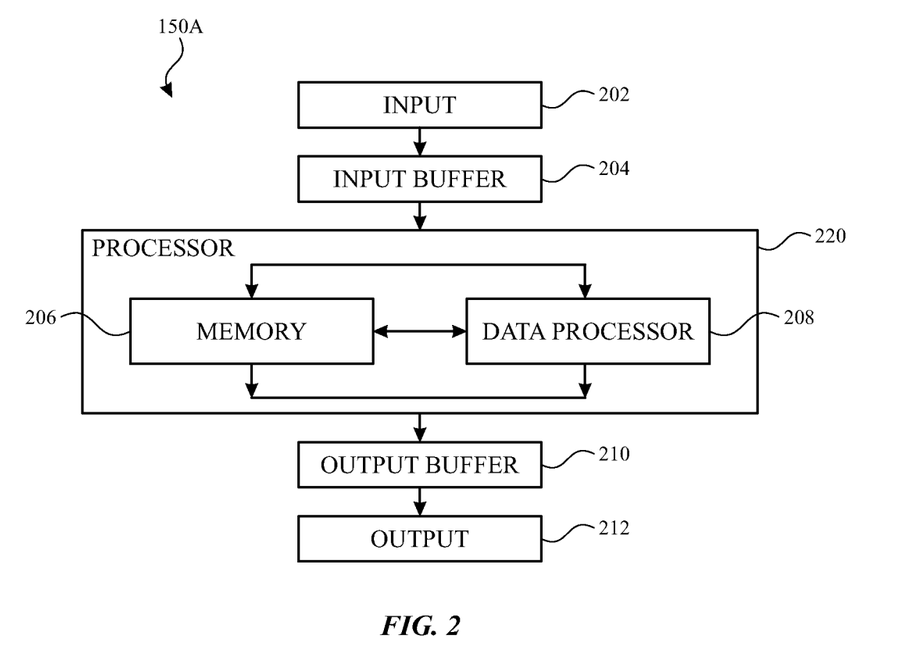
FIG. 2 illustrates data flow in a device used for processing data in accordance with one or more implementations.

FIG. 2 illustrates data flow in a device used for processing data in accordance with one or more implementations. Typical processing of data (e.g., at one of the pair of earbuds 150A) begins when the data is received at an input 202. The data is then transferred to a processor 220, where it is processed, and output to the output 212.

While FIG. 1 shows the electronic device 150 to be a pair of earbuds 150A and 150B as an example, the electronic device 150 can be any suitable device. Examples can include input devices (e.g., stylus, mouse, trackpad, keyboard, camera, microphone etc.), output devices (e.g., speaker, display, haptic output device, home pod, etc.), peripheral device, home automation device (e.g., thermostat, doorbell, light switch), smart appliance (e.g., fridge, etc.) sensor device (e.g., fingerprint sensor, biometric sensor, robot sensor, vehicle sensor, appliance sensor, etc.), computing device (e.g., iPhone, laptop, FPGA, embedded computing device, etc.), electronic key, wearable device, health tracking device, accessory device.

The electronic device 150 may include, for example, one or more wireless interfaces, such as WLAN radios, cellular radios, Bluetooth radios, Zigbee radios, near field communication (NFC) radios, and/or other wireless radios. The device may be, and/or may include all or part of, the electronic system discussed herein with respect to FIG. 7. In one or more implementations, the device may include one or more input devices such as, for example, a touch activated input region or a button. In one or more implementations, the device may pair with other devices such as a desktop computer, a laptop or a portable computer, a mobile electronic device, or a wearable device.

The processor 220 may include a memory 206 and a data processor 208. Depending on specific implementations, the processor 220 may also include other processors such as, for example, a graphics processor (which is not explicitly shown in FIG. 2). Thus, based on the type of device, the data processor 208 may perform, among other things, compression and/or decompression of the received data, transform the received data into an audio, video or an audiovisual stream, render the received data into an image, encrypt the received data for storage, modulate or demodulate the received data, and/or perform other data manipulation.

In implementations such as earbuds, the processor 220 from one of the pair of earbuds may receive state information relating to the other earbud and process the audio data based on the state information to, for example, dynamically adjust volume of certain audio frequencies or otherwise manipulate the audio output to appropriately synchronize the audio output with the other earbud. In some implementations, the state information is received from the other earbud or from a connected and/or paired device such as, for example, a smartphone, a laptop computer, a desktop computer, or other electronic device capable of playing media.

In some implementations, because of microarchitecture constraints, the processor 220 may have limited processing resources. Processing resources can include a processing unit (e.g., CPU), FPGA, ASIC, hardware electronic circuit, etc. For example, in some implementations, data processing algorithms (e.g., a data compression and/or a data decompression algorithm) can be performed by hardcoded circuits that are designed for efficient power consumption and memory usage, rather than a general purpose processor that executes instructions. In some implementations, the processing resources of the processor 220 include a memory 206 which may be used as a cache or to provide a data buffer for certain data processing algorithms.

For example, in some implementations, while processing the received data, the data processor 208 may store some or all of received data, processed data and/or intermediate data in memory 206. The memory 206 may include RAM, ROM, and/or non-volatile memory.

Upon or during the processing the data, the data processor 208 may write the processed data to the memory 206 and/or to an output buffer 210. In some implementations, the output buffer may receive data directly from the memory 206. In some implementations, the data processor 208 can write data directly from the input buffer 204 to the output buffer 210 without writing any data to the memory 206.

Figure 3:
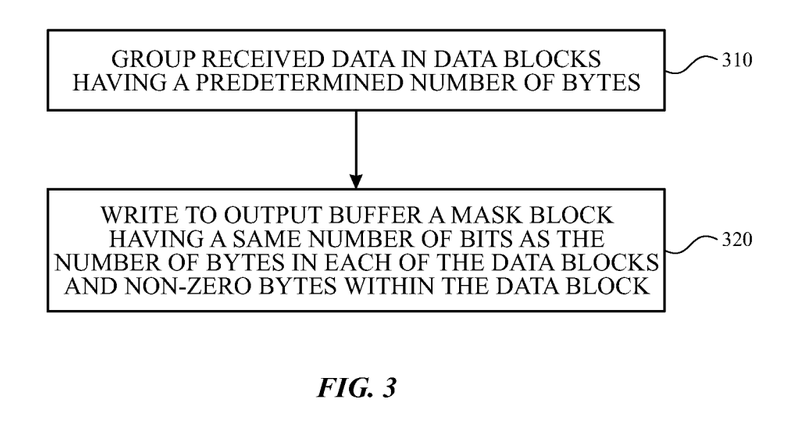
FIG. 3 illustrates a flow diagram of an example process for coding an input stream directly onto an output buffer in accordance with one or more implementations.

FIG. 3 illustrates a flow diagram of an example process for coding an input stream directly onto an output buffer in accordance with one or more implementations. At 310, received data is grouped in data blocks having a predetermined number of bytes.

The data may include state information. The state information can be communicated among the devices using wireless interfaces; the compression/decompression algorithm underlying the method disclosed herein can conserve battery power by limiting the amount of data that needs to be transmitted wirelessly, thereby reducing the time that the wireless interface's radio transmitter is consuming power to perform radio transmission. The state information need not necessarily be communicated wirelessly. For example, the state information can be communicated among the devices using wired interfaces. Even in such implementations, the reduction in the amount of data transmitted as well as written on working memory or an additional buffer provides reduction in power consumption and improvement in speed of data transmission.

In one or more implementations, the state information can be weights for a machine learning model. For example, each byte of the input data can represent a weight value for a respective feature. In such implementations, zero bytes can represent features that are not used by the model. In models that process input data sets with hundreds of thousands of features, there can be many zero bytes in the state for the model's weight parameters. The large number of zero bytes in the state information for such a machine learning model can be compressed effectively by the methods disclosed herein to a high compression ratio and without the use of working memory and/or additional buffer. In an example, the device performing the compression trains a local model as part of a federated learning process and generates state information that represents the weight values for the parameters of the locally trained model. The device may perform the compression of the state information using the encoding process disclosed herein before transmitting the state information to another device that processes the state information in conjunction with the federated learning process.

In one or more implementations, the state information may be data sets used for training a machine learning model. For example, each byte can represent a value for a respective feature. In such implementations, zero bytes can represent features for which there is no data. In large data sets with hundreds of thousands of features, there can be many zero bytes corresponding to features without any data. In an example, the device performing the compression accesses training data for use in training a machine learning model. The device may perform the compression of the training data using the encoding process disclosed herein. In some examples, the device includes a sensor, and each set of training data is data captured by the sensor, and the data captured by the sensor is multi-dimensional.

Referring back to FIG. 3, the data block in which the received data is grouped at 310 may have any suitable number of bytes. For example, the data block may have any number of bytes, such as, for example, 2, 3, 4, 5, 6, 7, 8, 9, 10, 11, 12, 13, 14, 15, 16, 17, 18, 19, 20, 21, 22, 23, 24, or more bytes. The number of bytes in which the received data is grouped may be determined by factors such as, but not limited to, expected data pattern, amount of data to be received, size of the input and/or output buffers, rate at which the data is received, desired compression ratio, and/or desired energy efficiency.

In one or more implementations, the size of the data block can be predetermined based on the expected data pattern for the received data. For example, in implementations where the received data includes state information, the received data may include a large number of zero-bytes. In such implementations, it may be more efficient to have larger data blocks such as, for example, a data block including 8 bytes (or integer multiples thereof).

At 220, a compressed data block is written to the output buffer. In one or more implementations, the compressed data block is written to the output buffer without using the working memory. In one or more implementations, the compressed data block includes a mask block and a subsequent block.

In one or more implementations, when writing the compressed data block to the output buffer, each byte within a given data block is checked to determine whether the byte is a zero-byte or a non-zero byte. If the byte is a zero-byte, the corresponding bit of the mask block is written as a zero bit and nothing is written in the subsequent block. If the byte is a non-zero byte, the corresponding bit of the mask block is written as a one bit, and the non-zero byte is written to the subsequent block directly following the last-written byte in the subsequent block. The process is then repeated for each received byte within the given data block.

In one or more implementations, the received data is checked to determine whether the byte is a zero-byte or a non-zero byte. If the byte is determined to be a zero-byte, a zero is written to the mask block in a corresponding position within the mask block. If the byte is determined to be a non-zero byte, a one is written to the mask block in a corresponding position within the mask block. The non-zero bytes are then written to the subsequent block in the order in which the non-zero bytes were read. In other words, within the compressed data block the mask block is written as the data is received and analyzed. The corresponding subsequent block is written after writing the mask block.

Thus, regardless of the process by which the compressed data block is written, the mask block corresponding to a given data block has the same number of bits as the number of bytes in the given data block. Further, the mask block includes, in the same order as the bytes within the given data block, a zero corresponding to each zero-byte within the given data block and a one corresponding to each non-zero byte within the given data block. The subsequent data block includes non-zero bytes from the given data block written in the same order as the non-zero bytes appear in the given data block.

For example, if the selected sized for a data block is 4 bytes (i.e., received data is grouped into 4-byte blocks at 310), and received data includes 0, 0, A, B, 0, 0, 0, 0, C, D, 0, E, the received data is grouped as: data block 1—0, 0, A, B; data block 2—0, 0, 0, 0; and data block 3—C, D, 0, E. At 320, the output data buffer includes the compressed data blocks: first compressed data block—a mask block having [0011] as bits and subsequent block having A, B as bytes; second compressed block—a mask block having [0000] as bits, and no subsequent block; and third compressed data block—a mask block having [1101] as bits and a subsequent block C, D and E as bytes.

Thus, the process of encoding data disclosed herein can effectively compress received data and write the compressed data directly to the output buffer. It will be appreciated that when the received data includes a large number of sequential zero-bytes, the encoded data may be compressed into a series of mask blocks depending on the selected size of the mask block. Consequently, an appropriate size of the mask block can be selected based on an expected data pattern to obtain a greater compression ratio.

In one or more implementations, the received data is grouped into 8-byte blocks. In other words, the predetermined number of bytes is 8. Such grouping results in each mask block having 8 bits, i.e., 1 byte. In other words, grouping the received data into 8-byte blocks results in a mask byte. In such implementations, if all of the bytes in a given data block are zero-bytes, then the compressed data block includes only the mask byte which itself is a zero-byte.

Figure 4:
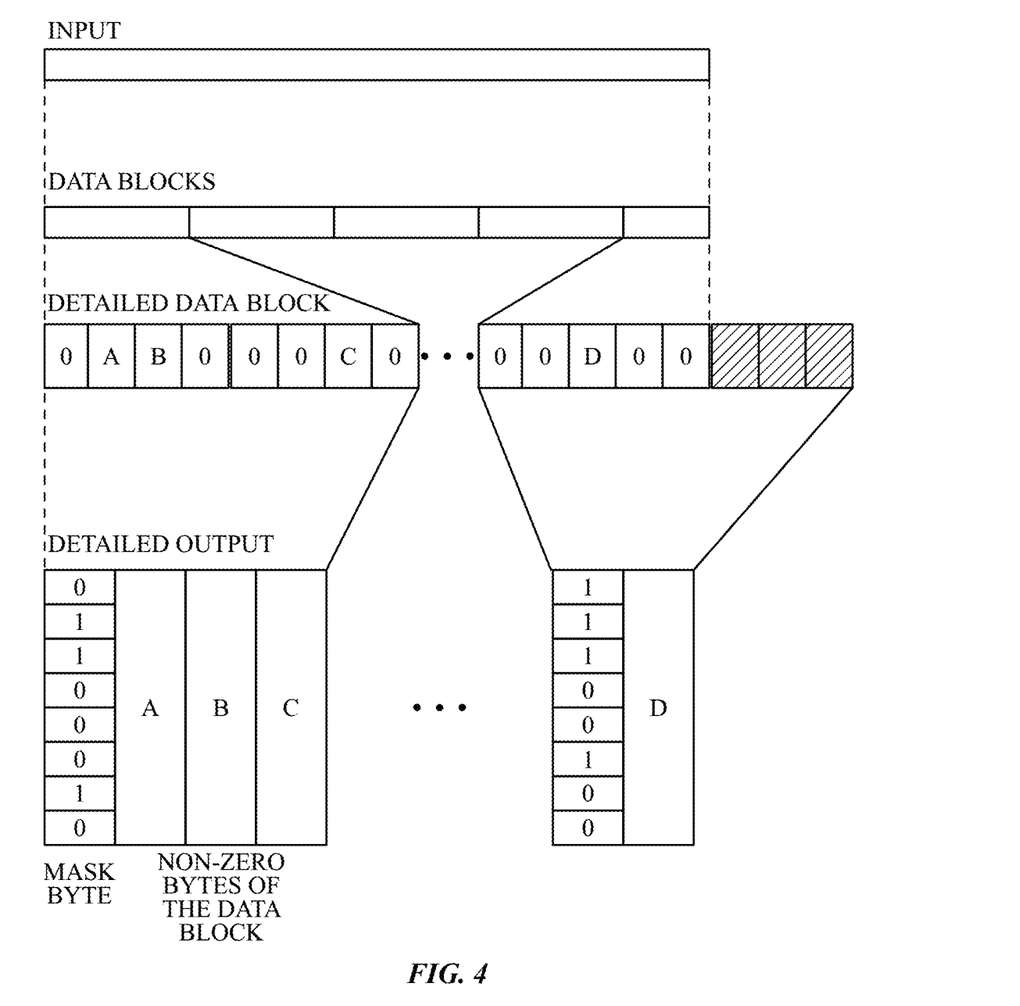
FIG. 4 illustrates an example of encoding of data received at an input stream in accordance with one or more implementations.

FIG. 4 illustrates an example of encoding of data received at an input stream in accordance with one or more implementations. The process illustrated in FIG. 4 shows an implementation in which the received data is grouped into 8-byte blocks, thereby resulting in a mask byte. In the example shown in FIG. 4, the first, fourth, fifth, sixth and eighth bytes of the received input are all zero bytes, and the second, third and seventh bytes are non-zero bytes (designated as A, B and C respectively).

Such a block of 8 bytes is encoded as compressed data block having: a mask byte having the first, fourth, fifth, sixth and eighth bits as zero and the second, third and seventh bits as one; and a subsequent block having A, B and C bytes in that sequence.

At the end of the received data, the last data block may have less number of bytes than the predetermined number of bytes for the data block. In implementations where a data block includes 8 bytes, for example, the last block may have less than 8 bytes (e.g., 4 bytes as illustrated in FIG. 4). In such implementations, each non-received byte in the last data block is written to the mask block as a one-bit, and in the subsequent block the corresponding bytes are not written. In other words, the subsequent block does not include any bytes corresponding to the non-received bytes in the last received data block.

In such implementations, the end of the received data is signaled by a one-bit in the mask block and no corresponding byte in the subsequent block. For example, as illustrated in FIG. 4, the last data block has only 5 bytes. Such a data block is encoded as a mask block having 5 bits corresponding to the 5 received bytes, and three sequential one-bits. The subsequent block, however, includes only the non-zero bytes corresponding to the non-zero bytes among the 5 received bytes. The last three sequential one-bits in the mask block do not have a corresponding non-zero byte in the subsequent block. Such a compressed data block represents end of the received data.

As evident from the FIG. 4, the compressed data block written to the output buffer is smaller than the received data block. For example, a block of 8 bytes including 3 non-zero bytes is compressed to 4 bytes, and a block of 5 bytes (last received data block) including one non-zero byte is compressed to 2 bytes. It will be appreciated that a block of 8 bytes including no non-zero bytes is compressed to a single byte, while a block of 8 bytes include all non-zero bytes is encoded to 9 bytes. Thus, the encoding process described herein is suitable for compressing data with a large number of sequential zero-bytes.

In some implementations, an even higher compression ratio can be obtained by nesting the encoding process. For example, a compressed data block can be further compressed by repeating the encoding process disclosed herein on the compressed data block. In such implementations, if the received data includes a large number of sequential zero-bytes interspersed with one or two sequential non-zero bytes, the compressed data block itself may include several sequential zero-mask bytes. Such a compressed data block, can be further compressed to provide a further compressed data block. The further compressed data block can include a nested mask block and a nested subsequent block.

In one example of a nested encoding process utilizing the encoding process described herein can group the received data into 8-byte data blocks, and the resulting compressed data block is further grouped into 8-byte blocks. Thus, a string of 64 zero-bytes can be compressed to a single mask byte using a nested encoding process. Consequently, if expected data to be processed has a data pattern as discussed herein, the nested encoding process can be used to obtain very high compression ratio. The high compression ratio, however, may come at the cost of processing speed and/or memory requirements, and may not be suitable for architectures with low memory availability and/or processes that require low latency. Nevertheless, for applications in which received data has a large number of sequential zero-bytes, and where memory availability and processing speed are not a constraint, and a very high compression ratio can be obtained using a nested encoding process described herein.

Figure 5A:
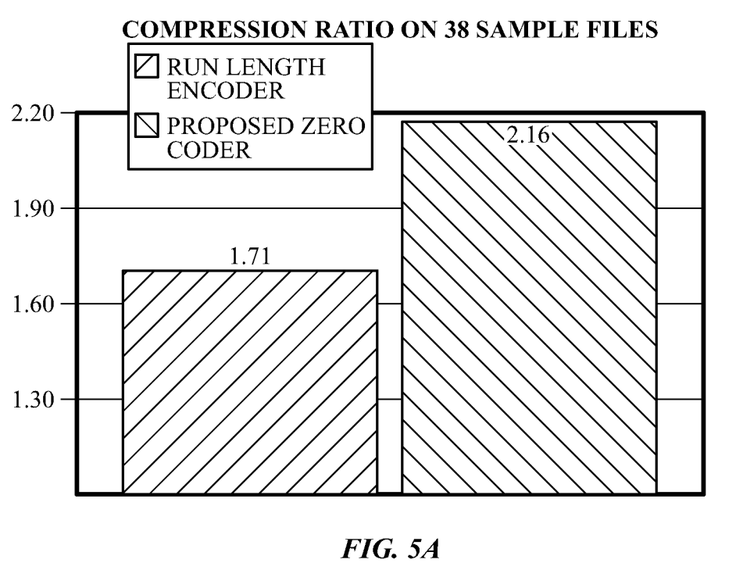
FIG. 5A illustrates a comparison of compression ratio provided by the encoding process disclosed herein and compression ratio provided by an example run-length encoding process.

FIG. 5A illustrates a comparison of compression ratio provided by the encoding process disclosed herein and compression ratio provided by an example run-length encoding process. As evident from FIG. 5A, when encoding state information relating to earphones, the encoding process disclosed herein provides a better compression ratio compared to the example run-length encoding process.

As discussed herein, in some implementations, the compressed data block is written directly to the output buffer, thereby avoiding any requirement for writing to a working memory or any additional buffer, consequently avoiding any power requirements associated with writing data to working memory or an additional buffer. Additionally, in implementations where the constraints on the microarchitecture and associated memory are tight, avoiding the need for writing to a working memory or an additional buffer also leaves all of the working memory available for the processor. Further, writing directly to the output buffer also reduces the time spent in compressing and decompressing the received data, thereby providing a faster compression and decompression of data when compared to other compression methods.

Figure 5B:
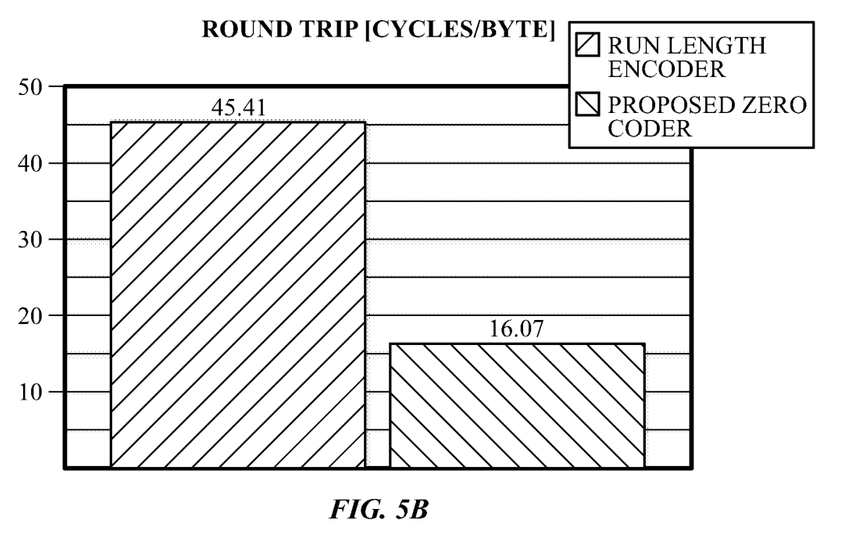
FIG. 5B illustrates a comparison of cycles/byte provided by the encoding process disclosed herein and cycles/byte provided by run-length encoding process on an example processor.

FIG. 5B illustrates a comparison of cycles/byte provided by the encoding process disclosed herein and cycles/byte provided by an example run-length encoding process. As evident from FIG. 5B, the encoding process disclosed herein requires substantially less number of cycles/byte when compared to run-length encoding process.

Figure 6:
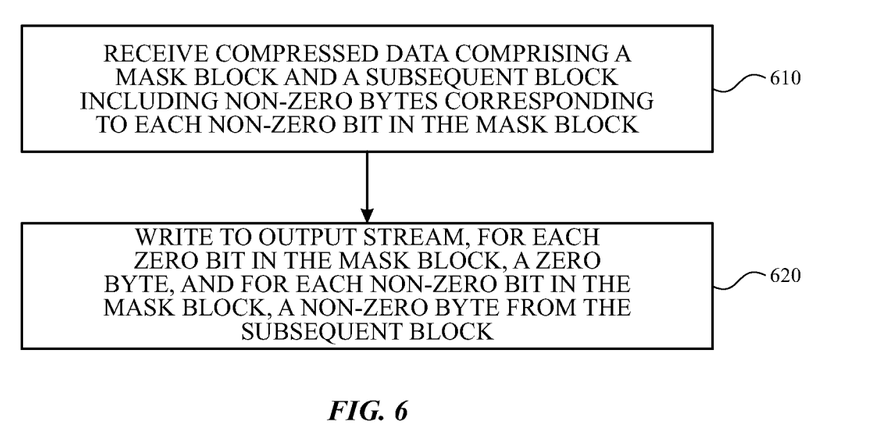
FIG. 6 illustrates a flow diagram of an example process for decoding compressed data directly onto an output stream in accordance with one or more implementations.

FIG. 6 illustrates a flow diagram of an example process for decoding a compressed data block directly onto an output stream in accordance with one or more implementations. At 610, compressed data block is received. The compressed data may be received from the memory or from an output buffer. The compressed data block includes a mask block and a subsequent block. The subsequent block includes non-zero bytes corresponding to each non-zero bit in the mask block.

In one or more implementations, the mask block may have any number of bits, such as, for example, 2, 3, 4, 5, 6, 7, 8, 9, 10, 11, 12, 13, 14, 15, 16, 17, 18, 19, 20, 21, 22, 23, 24, or more bits. Correspondingly, the subsequent block may include 1, 2, 3, 4, 5, 6, 7, 8, 9, 10, 11, 12, 13, 14, 15, 16, 17, 18, 19, 20, 21, 22, 23, 24, or more non-zero bytes. The sizes of the mask block and the subsequent block is determined by the encoding algorithm such as one disclosed herein with reference to FIG. 2, as well as by the size of the output buffer.

In some implementations, the mask block may have 8 bits, thereby encoding a data block of 8 bytes. In such implementations, a compressed data block including a mask block and a subsequent block having non-zero bytes encodes a decompressed data block of 8 bytes.

At 620, decompressed data is written (e.g., directly) to an output stream. Specifically, for each zero bit in the mask block, a zero-byte corresponding to the zero bit is written to the output stream. Additionally, for each one bit in the mask block, a corresponding non-zero byte from the subsequent block is written to the output stream.

Referring back to FIG. 4, for example, for the first block of encoded data, the first, fourth, fifth, sixth and eighth of the mask block are zero bits, while the second, third and seventh are non-zero bits. The subsequent block has non-zero bytes A, B and C. Upon receiving such a block of encoded data, the first, fourth, fifth, sixth and eighth bytes written to the output stream are written as zero-bytes, the second byte written to the output stream is written as A, the third byte is written as B and the seventh byte is written as C.

In certain situations, such as for example, the encoded data does not include a whole data block. In such situations, a mask block includes a non-zero bit and the subsequent block lacks a corresponding non-zero byte. When decoding such a block of encoded data, no data is written to the output stream corresponding to the first instance of a non-zero bit within the mask block that lacks a corresponding non-zero byte in the subsequent block, signaling the end of the data stream.

As described above, in some embodiments, the process for encoding a stream of data including encoding the compressed data directly to an output buffer without the use of working memory and/or an additional buffer. In some embodiments, the process for decoding includes decompressing compressed data directly to an output stream without the use of working memory and/or an additional buffer.

FIG. 7 illustrates an electronic system 700 with which one or more implementations of the subject technology may be implemented. The electronic system 700 can be, and/or can be a part of, the electronic device 110, shown in FIG. 1. The electronic system 700 may include various types of computer readable media and interfaces for various other types of computer readable media. The electronic system 700 includes a bus 708, one or more processing unit(s) 712, a system memory 704 (and/or buffer), a ROM 710, a permanent storage device 702, an input device interface 714, an output device interface 706, and one or more network interfaces 1016, or subsets and variations thereof.

The bus 708 collectively represents all system, peripheral, and chipset buses that communicatively connect the numerous internal devices of the electronic system 700. In one or more implementations, the bus 708 communicatively connects the one or more processing unit(s) 712 with the ROM 710, the system memory 704, and the permanent storage device 702. From these various memory units, the one or more processing unit(s) 712 retrieves instructions to execute and data to process in order to execute the processes of the subject disclosure. The one or more processing unit(s) 712 can be a single processor or a multi-core processor in different implementations.

The ROM 710 stores static data and instructions that are needed by the one or more processing unit(s) 712 and other modules of the electronic system 700. The permanent storage device 702, on the other hand, may be a read-and-write memory device. The permanent storage device 702 may be a non-volatile memory unit that stores instructions and data even when the electronic system 700 is off. In one or more implementations, a mass-storage device (such as a magnetic or optical disk and its corresponding disk drive) may be used as the permanent storage device 702.

In one or more implementations, a removable storage device (such as a floppy disk, flash drive, and its corresponding disk drive) may be used as the permanent storage device 702. Like the permanent storage device 702, the system memory 704 may be a read-and-write memory device. However, unlike the permanent storage device 702, the system memory 704 may be a volatile read-and-write memory, such as random access memory. The system memory 704 may store any of the instructions and data that one or more processing unit(s) 712 may need at runtime. In one or more implementations, the processes of the subject disclosure are stored in the system memory 704, the permanent storage device 702, and/or the ROM 710. From these various memory units, the one or more processing unit(s) 712 retrieves instructions to execute and data to process in order to execute the processes of one or more implementations.

The bus 708 also connects to the input and output device interfaces 714 and 706. The input device interface 714 enables a user to communicate information and select commands to the electronic system 700. Input devices that may be used with the input device interface 714 may include, for example, alphanumeric keyboards and pointing devices (also called "cursor control devices"). The output device interface 706 may enable, for example, the display of images generated by electronic system 700. Output devices that may be used with the output device interface 706 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 7, the bus 708 also couples the electronic system 700 to one or more networks and/or to one or more network nodes through the one or more network interface(s) 716. In this manner, the electronic system 700 can be a part of a network of computers (such as a LAN, a wide area network ("WAN"), or an Intranet, or a network of networks, such as the Internet. Any or all components of the electronic system 700 can be used in conjunction with the subject disclosure.

In accordance with various aspects of the subject disclosure, a method includes grouping received data in data blocks having a predetermined number of bytes. For each received data block, a compressed data block is written to an output buffer. The compressed data block includes: (a) a mask block having a same number of bits as the predetermined number, and (b) a subsequent block. The mask block includes in a same order as bytes within the corresponding data block, a zero corresponding to a zero-byte within the data block, and a one corresponding to each non-zero byte within the data block. The subsequent block includes non-zero bytes within the corresponding data block in a same order as the non-zero bytes within the data block.

In accordance with various aspects of the subject disclosure, a method includes receiving a compressed data block including: (a) a mask block, and (b) a subsequent block (which sequentially includes non-zero bytes corresponding to each non-zero bit in the mask block). For each zero bit in the mask block, a zero-byte corresponding to the zero bit is written to the output stream. For each non-zero bit in the mask block, a corresponding non-zero byte from the subsequent block is written to the output stream.

In accordance with various aspects of the subject disclosure, a non-transitory computer-readable medium is provided that includes instructions, which when executed by at least one computing device, cause the at least one computing device to perform operations including grouping received data in data blocks having a predetermined number of bytes. For each received data block, a compressed data block is written to an output buffer. The compressed data block includes: (a) a mask block having a same number of bits as the predetermined number, and (b) a subsequent block. The mask block includes in a same order as bytes within the corresponding data block, a zero corresponding to a zero-byte within the data block, and a one corresponding to each non-zero byte within the data block. The subsequent block includes non-zero bytes within the corresponding data block in a same order as the non-zero bytes within the data block.

In accordance with various aspects of the subject disclosure, a non-transitory computer-readable medium is provided that includes instructions, which when executed by at least one computing device, cause the at least one computing device to perform operations including receiving a compressed data block including: (a) a mask block, and (b) a subsequent block (which sequentially includes non-zero bytes corresponding to each non-zero bit in the mask block). For each zero bit in the mask block, a zero-byte corresponding to the zero bit is written to the output stream. For each non-zero bit in the mask block, a corresponding non-zero byte from the subsequent block is written to the output stream.

In accordance with various aspects of the subject disclosure, a device is provided that includes a memory and at least one processor communicatively coupled to the memory. The at least one processor is configured to group received data in data blocks having a predetermined number of bytes. For each received data block, the at least one processor writes a compressed data block to an output buffer. The compressed data block includes: (a) a mask block having a same number of bits as the predetermined number, and (b) a subsequent block. The mask block includes in a same order as bytes within the corresponding data block, a zero corresponding to a zero-byte within the data block, and a one corresponding to each non-zero byte within the data block. The subsequent block includes non-zero bytes within the corresponding data block in a same order as the non-zero bytes within the data block.

In accordance with various aspects of the subject disclosure, a device is provided that includes a memory and at least one processor communicatively coupled to the memory. The at least one processor is configured receive a compressed data block including: (a) a mask block, and (b) a subsequent block (which sequentially includes non-zero bytes corresponding to each non-zero bit in the mask block). For each zero bit in the mask block, the at least one processor writes a zero-byte corresponding to the zero bit to the output stream. For each non-zero bit in the mask block, the at least one processor writes a corresponding non-zero byte from the subsequent block to the output stream.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other implementations. Furthermore, to the extent that the term "include", "have", or the like is used in the description or the claims, such term is intended to be inclusive in a manner similar to the phrase "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method comprising:
grouping received data in data blocks, each data block having a predetermined number of bytes; and
writing directly to an output buffer and not to an interim memory location, for wireless transmission to a device, for each data block, a compressed data block comprising:
a mask block having a same number of bits as the predetermined number, the mask block comprising, in a same order as bytes within that data block, a zero corresponding to a zero-byte within that data block, and a one corresponding to each non-zero byte within that data block, and
a subsequent block following the mask block, the subsequent block comprising non-zero bytes within that data block in a same order as the non-zero bytes within that data block.

2. The method of claim 1, wherein the predetermined number of bytes is 8.

3. The method of claim 2, wherein the mask block is a mask byte, and a received data block with all zero-bytes is written to the output buffer as a zero mask byte.

4. The method of claim 1, wherein, in response to the received data having a size smaller than one data block, the mask block includes a one corresponding to each non-received byte and the subsequent block includes only the non-zero bytes of the received data.

5. The method of claim 1, wherein the received data is associated with state information relating to one of a pair of earphones that is paired to a mobile electronic device.

6. A method comprising:
receiving, from a first audio device and to a second audio device, a compressed data block comprising a mask block and a subsequent block sequentially including non-zero bytes corresponding to each non-zero bit in the mask block; and
writing to an output stream:
for each zero bit in the mask block, a zero-byte corresponding to the zero bit, and
for each non-zero bit in the mask block, a corresponding non-zero byte from the subsequent block,
wherein the received compressed data block comprises state information of the first audio device, the state information relating to switching a role of the first audio device to the second audio device, the first audio device or the second audio device being paired to a mobile electronic device.

7. The method of claim 6, wherein the mask block has 8 bits.

8. The method of claim 7, wherein the compressed data block corresponds to an 8-byte block of uncompressed data.

9. The method of claim 6, wherein the compressed data block is received from an output buffer.

10. The method of claim 6, wherein zero-bytes and non-zero bytes are written to the output stream in a same order as zeros and ones in the mask block respectively.

11. A non-transitory computer-readable medium including instructions, which when executed by at least one computing device, cause the at least one computing device to perform operations including:
grouping received data in data blocks having a predetermined number of bytes;
writing to an output buffer, for each data block, a compressed data block comprising:
a mask block having a same number of bits as the predetermined number, the mask block comprising, in a same order as bytes within that data block, a zero corresponding to a zero-byte within that data block, and a one corresponding to each non-zero byte within that data block, and
a subsequent block, following the mask block, the subsequent block comprising non-zero bytes within that data block in a same order as the non-zero bytes within the data block,
wherein, in response to the received data having a number of bytes smaller than the predetermined number of bytes, the mask block includes a one corresponding to each remaining byte of the predetermined number of bytes, and the subsequent block includes only the non-zero bytes of the received data.

12. The non-transitory computer-readable medium of claim 11, wherein the predetermined number of bytes is 8.

13. The non-transitory computer-readable medium of claim 11, wherein the writing to the output buffer comprises writing the compressed data block directly to an output buffer and not to an interim memory location, for wireless transmission to an audio device.

14. A non-transitory computer-readable medium including instructions, which when executed by at least one computing device, cause the at least one computing device to perform operations including:
receiving, from an audio device, a compressed data block comprising a mask block and a subsequent block sequentially including non-zero bytes corresponding to each non-zero bit in the mask block; and
writing to an output stream:
for each zero bit in the mask block, a zero-byte corresponding to the zero bit, and
for each non-zero bit in the mask block, a corresponding non-zero byte from the subsequent block,
wherein the received compressed data block comprises state information of the audio device, the state information relating to switching a role of the audio device from the audio device to the computing device.

15. The non-transitory computer-readable medium of claim 14, wherein zero-bytes and non-zero bytes are written to the output stream in a same order as zeros and ones in the mask block respectively.

16. The non-transitory computer-readable medium of claim 14, wherein the mask block has 8 bits.

17. The non-transitory computer-readable medium of claim 14, the compressed data block corresponds to an 8-byte block of uncompressed data.

18. A device including an input, an output, a memory and at least one processor communicatively coupled to the memory, the at least one processor configured to:
group received data in data blocks, each data block having a predetermined number of bytes;
write to an output location, for each data block, a compressed data block comprising:
a mask block having a same number of bits as the predetermined number, the mask block comprising, in a same order as bytes within that data block, a zero corresponding to a zero-byte within that data block, and a one corresponding to each non-zero byte within that data block, and a subsequent block following the mask block, the subsequent block comprising non-zero bytes within that data block in a same order as the non-zero bytes within that data block;

group the compressed data block into second data blocks, each second data block having a second predetermined number of bytes; and write to an output buffer, for each second data block, a second compressed data block comprising:

a second mask block having a same number of bits as the second predetermined number, the second mask block comprising, in a same order as bytes within that second data block, a zero corresponding to a zero-byte within that second data block, and a one corresponding to each non-zero byte within that second data block, and a second subsequent block following the second mask block, the second subsequent block comprising non-zero bytes within that second data block in a same order as the non-zero bytes within that second data block.

19. The device of claim 18, wherein, in response to the received data having a size smaller than one data block, the at least one processor to write:

a one in the mask block corresponding to each non-received byte, and only the non-zero bytes of the received data in the subsequent block.

20. A device including an input, an output, a memory and at least one processor communicatively coupled to the memory, the at least one processor configured to:

receive, from an audio device, a compressed data block comprising a mask block and a subsequent block sequentially including non-zero bytes corresponding to each non-zero bit in the mask block; and write to an output stream:

for each zero bit in the mask block, a zero-byte corresponding to the zero bit, and for each non-zero bit in the mask block, a corresponding non-zero byte from the subsequent block, wherein the received compressed data block comprises state information of the audio device, the state information relating to switching a role of the audio device from the audio device to the device.

* * * * *